United States Patent [19]

Vig

[11] Patent Number: 4,539,532

[45] Date of Patent: Sep. 3, 1985

[54] METHOD OF MINIMIZING THE AGING RATE OF AN OSCILLATOR

[75] Inventor: John R. Vig, Colts Neck, N.J.

[73] Assignee: The United States of America as represented by the Secretary of the Army, Washington, D.C.

[21] Appl. No.: 603,253

[22] Filed: Apr. 23, 1984

[51] Int. Cl.³ .............................................. H03B 5/32
[52] U.S. Cl. .................................... 331/69; 331/158; 331/160
[58] Field of Search ............. 331/116 R, 116 FE, 69, 331/158, 160; 310/311, 314, 341, 343, 344

[56] References Cited

U.S. PATENT DOCUMENTS 3,560,880 2/1971 Easton et al. ...................... 331/158

OTHER PUBLICATIONS

Gerber et al., "Quartz Frequency Standards", Proceedings of the IEEE, vol. 55, No. 6, Jun. 1967, pp. 783–791.
Olster et al., "A Monolithic Crystal Filter Design for Manufacture and Device Quality", Proceedings of the 29th Annual Frequency Control Symposium, 1975, pp. 105–112.

Primary Examiner—Siegfried H. Grimm
Attorney, Agent, or Firm—Anthony T. Lane; Jeremiah G. Murray; Roy E. Gordon

[57] ABSTRACT

The aging rate of an oscillator is minimized by applying a high drive current to the resonator early in the oscillators life until the aging rate decreases to a low value and then applying a low drive current to the resonator for the rest of the oscillators life at a constant temperature.

6 Claims, 3 Drawing Figures

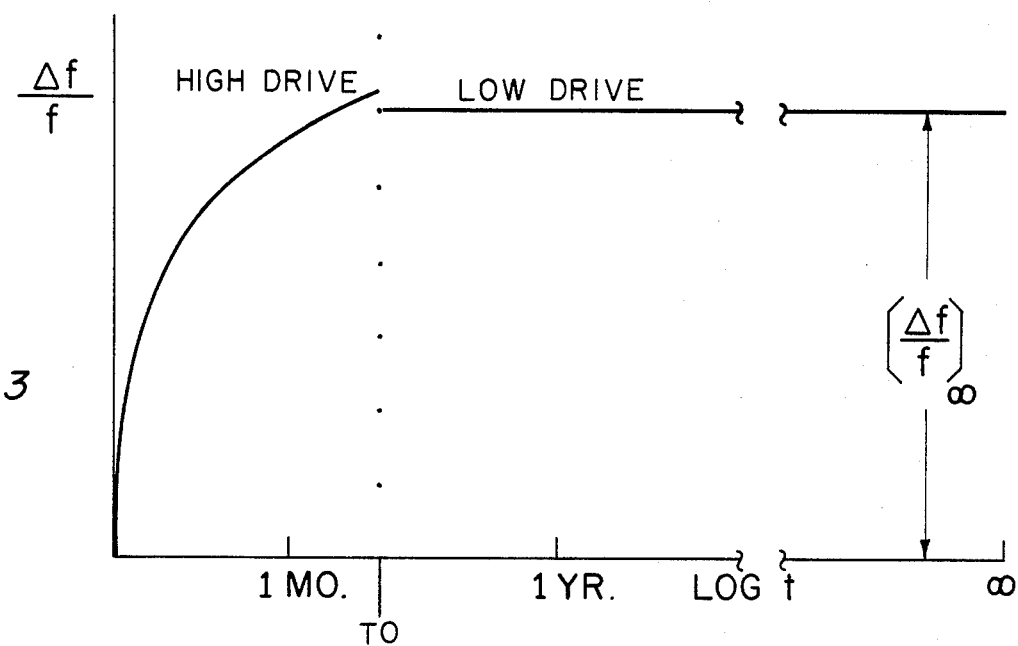

4,539,532

METHOD OF MINIMIZING THE AGING RATE OF AN OSCILLATOR

The invention described herein may be manufactured, used, and licensed by or for the Government for governmental purposes without the payment to me of any royalty thereon.

This invention relates to a method of minimizing the aging rate of quartz crystal oscillators.

BACKGROUND OF THE INVENTION

Heretofore, it has been known that in order to obtain the lowest aging rate in an oscillator, the drive current through the resonator had to be low. Typically, the drive current has been set to a value between 0.1 and 1.5 ma. A higher drive current has been known to result in higher aging rates. The reasons for the high aging rates are not fully understood. One reason that can account for the higher aging rates is that, at high drive currents, the resonators become more nonlinear, that is, slight changes in drive current can cause significant frequency changes. Another reason is that at higher drive currents, particles and molecules that are adsorbed onto the resonator's surfaces experience larger accelerations. Those larger accelerations increase the probabilities of desorption. Particles desorbing result in frequency jumps; molecules desorbing faster add a positive contribution to the aging rate.

On the other hand, the difficulty with the continuous low drive current as currently employed is that, at low drive, the aging rate of the oscillator decreases at a very slow rate that is unacceptable for many applications as for example, as an oscillator for a satellite capable of operating continuously for many years.

Heretofore, the only accelerated aging tests that have been applied to quartz resonators and oscillators have consisted of operating the resonators and oscillators at elevated temperatures, e.g. one to three weeks at 125° C., or the thermal step stress method described by S. H. Olster et al, in an article entitled "A Monolithic Crystal Filter Design for Manufacture and Device Quality", on pages 105–112 of the Proceedings of the 29th Annual Symposium of Frequency Control, 1975. Such accelerated aging has been useful for process control, but not for improving the long term aging at the normal operating temperatures.

SUMMARY OF THE INVENTION

The general object of this invention is to provide a method of minimizing the aging rate of quartz crystal oscillators. A more particular object of the invention is to provide such a method of making quartz crystal oscillators capable of operating continuously for many years. A particular object of the invention is to provide such a method of making quartz crystal oscillators for satellites. An additional object of this invention is to accelerate the aging rate of quartz crystal oscillators for quality control purposes.

It has now been found that the aforementioned objects can be attained by applying a high drive current to the resonator early in the oscillator's life until the aging rate decreases to a low value and then applying a low drive current to the resonator for the rest of the oscillator's life at a constant temperature.

According to the method of the invention, one trades off a higher aging rate during the early portions of an oscillator's life for a lower aging rate later. That is, by applying a high drive to the resonator early in the oscillators life, one can accelerate the aging, both for quality control purposes and for minimizing the aging rate later in the oscillator's life.

DESCRIPTION OF THE DRAWING

FIG. 3 shows the aging of a crystal oscillator with the high drive "preconditioning" according to the method of the invention.

Referring to FIG. 1, under constant conditions, the aging rate decreases to zero after an infinite time. The total aging between $t=0$ and $t=\infty$ depends on the amount of contamination that must be transferred to reach an equilibrium between adsorbing and desorbing molecules, on the amount of mounting, bonding, electrode and internal quartz stresses that must be relieved, on the amount of changes that must take place in the components of the oscillator, etc. Drive level will affect at least some of the rates at which these various contributing factors change, but not the total amounts of the changes, because increasing the drive level does not introduce any new aging mechanisms, as long as the drive level is not so high as to damage the resonator. In high quality resonators even drive levels of tens of milliamperes do not cause damage.

Figure 1:
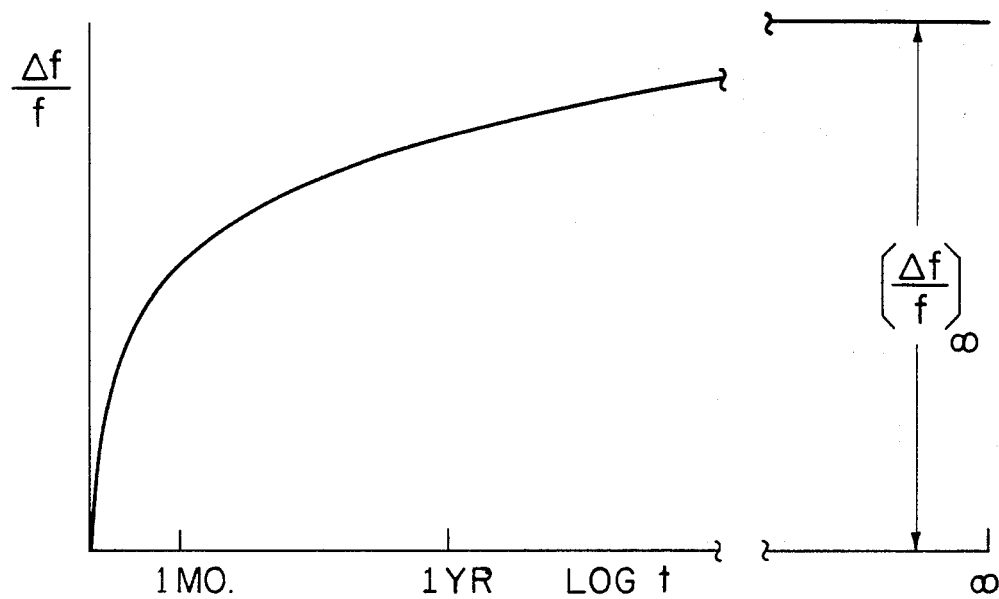
FIG. 1 shows the aging of a crystal oscillator at constant temperature, drive level, etc.

In the drawing, $(\Delta f/f)\infty$ is the total frequency change after an infinite amount of time. As long as the oscillator is maintained under constant conditions and the drive level is kept below levels that damage the resonator, the value of $(\Delta f/f)$ is independent of drive level, and one is able to trade off a higher aging rate during the early portions of an oscillator's life for a lower aging rate later.

Figure 2:
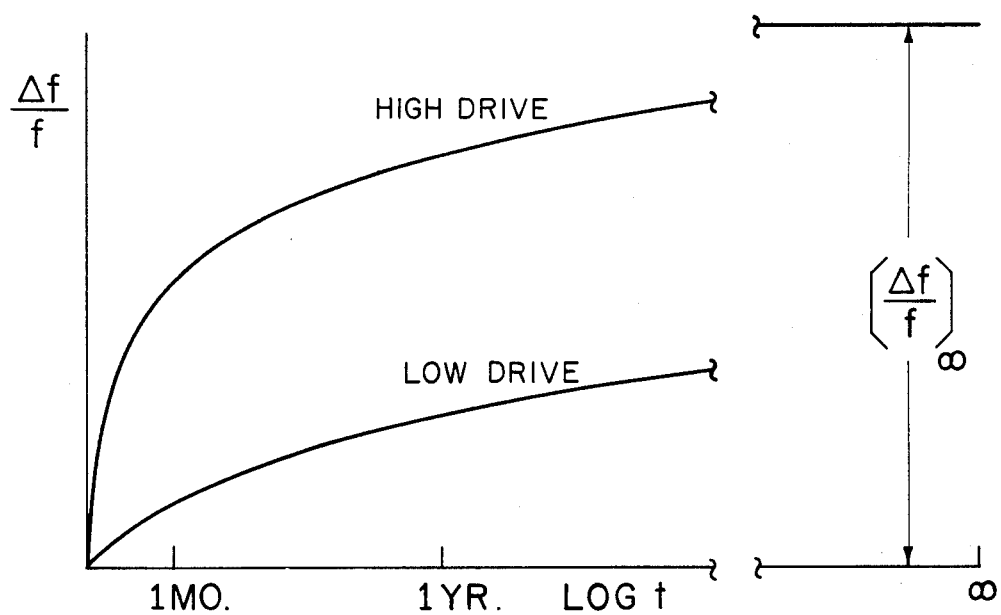
FIG. 2 shows a comparison between the aging of an oscillator at low drive conditions and at high drive conditions.

Referring to FIG. 2, in the high drive oscillator, the initial aging rate is higher, however, later, the aging rate is significantly lower because a much larger fraction of the total aging, $(\Delta f/f)$ occurs during the early part of the oscillator's life.

A potential problem with operating an oscillator continuously at high drive is that at high drive, resonators are nonlinear. For example, for a 5 MHz 5th overtone AT-cut resonator, the frequency varies $1\times 10^{-9}$ per $\mu W$ dissipated in the resonator. For such a resonator, in order for the oscillator to remain stable to within $1\times 10^{-12}$, the drive level must be kept constant to $+1$ nW at 1 $\mu W$ drive. At higher drive levels, the nonlinearity increases significantly for AT-cut resonators, which requires that the drive level be kept constant to unrealistically tight tolerances. Properly designed SC-cut resonators exhibit lower frequency-drive level nonlinearity than AT-cut resonators, however, the nonlinearity exists even for SC-cut resonators.

Another difficulty with operating oscillators at high drive is that at high drive, the incidence of activity dips increases. In order to minimize activity dips, the "rule of thumb" for AT-cut resonators is that the drive current must be kept below 2 ma. SC-cut resonators are generally free of activity dips at "normal" drive levels. Although SC-cut resonators can operate activity-dip free at higher drive levels than AT-cut resonators, it is not yet known what "rules of thumb" apply to activity dips in SC-cut resonators. At extremely high drive levels, the electrodes can be driven off the resonator and the resonator blank can also be damaged.

DESCRIPTION OF THE PREFERRED EMBODIMENT

The difficulties associated with high drive levels preventing stable operation of the oscillator can be avoided by designing the oscillator to have variable drive level. A variable drive level oscillator can be designed by, for example, having the resonator be part of two separate oscillating loops, one for the low drive the other for the high drive, or by using a reflectometer-type oscillator. For example, an oscillator can be designed to provide for the drive current to be changeable between 0.5 ma and 20 ma. If a third overtone SC-cut resonator of 100Ω resistance is used, then at the 20 ma drive current, the power dissipated in the resonator is 40 mW which is sufficient to increase the resonator's temperature from what it is at 0.5 ma in a constant temperature oven. Therefore, the oven temperature may be adjusted so as to compensate for the different power dissipation and thereby insure that the resonator temperature remains constant, at the resonator's turnover temperature, at all times. The oven temperature would be adjusted initially to the resonator's turnover while the resonator is driven at the lower drive current. The drive current would then be changed to 20 ma. The oscillator would age at that drive level until the aging rate decreases to a low value. The drive current would then be changed back to 0.5 ma for the rest of the oscillator's (constant temperature) life. If the oven is turned off, then the high drive stabilization may need to be repeated. The aging would proceed as shown in FIG. 3. The change to low drive takes place at $t=t_o$. The frequency offset at $t=t_o$ is due to the drive level dependence of frequency.

The above method of obtaining low aging rates is particularly useful in satellite oscillators, since such oscillators operate continuously, for many years, in a relatively benign environment.

When the method shown in FIG. 3 is used, it may be desirable to synchronize a gradual change in drive level with a compensating signal adjustment in oven temperature, in order to minimize the change in resonator temperature that can be caused by the drive level change. The high drive preconditioning can also accelerate the aging of non-temperature controlled oscillators.

I wish it to be understood that I do not desire to be limited to the exact details as described for obvious modifications will occur to a person skilled in the art.

What is claimed is:

1. Method of minimizing the aging rate of an oscillator comprising applying a high drive current to the resonator early in the oscillators life until the aging rate decreases to a low value and then applying a low drive current to the resonator for the rest of the oscillators life.

2. Method according to claim 1 wherein the resonator is maintained at constant temperature at all times.

3. Method according to claim 1 wherein the high drive current is about 20 milliamperes and wherein the low drive current is about 0.5 milliampere.

4. Method according to claim 3 wherein the resonator is a third overtone SC-cut resonator of 100 ohms resistance.

5. Method according to claim 1 wherein the resonator is an AT-cut resonator and wherein the low drive current is kept below 2 milliamperes.

6. Method according to claim 2 wherein the resonator is maintained at a constant temperature by adjusting the oven temperature so as to compensate for the change in power dissipation when the drive current is changed.

* * * * *